(12) United States Patent
Lee

(10) Patent No.: US 6,475,900 B2
(45) Date of Patent: Nov. 5, 2002

(54) METHOD FOR MANUFACTURING A METAL INTERCONNECTION HAVING ENHANCED FILLING CAPABILITY

(75) Inventor: Sung-Kwon Lee, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 2 days.

(21) Appl. No.: 09/739,293

(22) Filed: Dec. 19, 2000

(65) Prior Publication Data

US 2001/0024688 A1 Sep. 27, 2001

(30) Foreign Application Priority Data

Dec. 29, 1999 (KR) .............................. 99-65103

(51) Int. Cl.[7] .............................. C23C 14/16
(52) U.S. Cl. .................. 438/626; 438/627; 438/629; 438/631; 438/632; 438/633; 438/646; 438/650; 438/686; 438/687; 438/692; 427/250
(58) Field of Search .................. 438/626, 627, 438/629, 631, 632, 633, 646, 650, 686, 687, 692; 427/250

(56) References Cited

U.S. PATENT DOCUMENTS 6,090,701 A * 7/2000 Hasunuma et al. ......... 438/632
6,249,055 B1 * 6/2001 Dubin ........................ 257/751

* cited by examiner

*Primary Examiner*—Timothy Meeks
(74) *Attorney, Agent, or Firm*—Finnegan, Henderson, Farabow, Garrett, & Dunner, L.L.P.

(57) ABSTRACT

A method for manufacturing a metal interconnection includes the steps of, preparing an active matrix provided with a substrate, an insulating layer and an opening formed through the insulating layer, forming a diffusion barrier layer on surfaces of the opening and the insulating layer, forming a protection layer on the diffusion barrier layer, forming a first metal layer into the opening and upon the protection layer, forming a second metal layer on the first metal layer, and polishing back the first and the second metal layer to a top surface of the insulating layer, thereby forming a metal interconnection.

8 Claims, 5 Drawing Sheets

US 6,475,900 B2

METHOD FOR MANUFACTURING A METAL INTERCONNECTION HAVING ENHANCED FILLING CAPABILITY

FIELD OF THE INVENTION

The present invention relates to a method for manufacturing a metal interconnection; and, more particularly, to the method for manufacturing the metal interconnection with enhanced filling capability by forming a protection layer on a diffusion barrier layer using a damascene process.

DESCRIPTION OF THE PRIOR ART

With a high integration of a semiconductor device, a copper interconnection is being applied to the device due to its low electrical resistance. For employing the copper interconnection in the semiconductor device, a damascene process is used because dry-etching process is hardly applied to deposit the copper interconnection.

Referring to FIGS. 1A to 1D, there are provided cross sectional views setting forth a conventional method for manufacturing the copper interconnection by using a damascene process.

The manufacturing steps begin with a preparation of active matrix 110 provided with a conductive layer 112. After this, an insulating layer 114 is formed on top of the conductive layer 112 and then, patterned into a predetermined configuration by using a damascene process, thereby obtaining an opening 116. Thereafter, a diffusion barrier layer 118, e.g., made of titanium/titanium nitride (Ti/TiN), is formed on entire surface including the opening 116 for preventing a penetration of copper atoms into the insulating layer 114.

In a next step as shown in FIG. 1B, a first copper layer 120 is formed on the diffusion barrier layer 118 by using a method such as a physical vapor deposition (PVD) technique at a room temperature.

In a subsequent step as shown in FIG. 1C, a second copper layer is formed on the first copper layer 120 for reflowing copper into the opening 116 by using the PVD technique at a high temperature, thereby obtaining a copper layer 120A. While depositing copper at the high temperature by the PVD technique, the first copper layer 120 reacts with the diffusion barrier layer 118, thereby forming an intermetallic compound 118A. That is, if the diffusion barrier layer is made of Ti/TiN layer, $Cu_3Ti$ intermetallic compound is formed between the first copper layer 120 and the diffusion barrier layer 118. The intermetallic compound 118A has a large grain size of $Cu_3Ti$ to cause a bad gap-fill property. That is, owing to the large grain size of the intermetallic compound 118A, it plays a role in preventing an adequate deposition in a bottom portion of the opening 116. Thus, a copper layer 120A with a predetermined thickness is formed only over the opening 116 so that there is happened a void 122 between the copper layer 120A and a copper layer 120C, as shown in FIG. 1C.

Finally, a copper layer is polished back to a top surface of the insulating layer, thereby a copper interconnection 120B being remained within the opening 116 as shown in FIG. 1D. Polishing back of the copper layer is accomplished by a chemical mechanical polishing (CMP) technique.

As described above, when the second copper layer is formed at the high temperature after forming the first copper layer at the room temperature, an intermetallic compound having the large grain size may occur on the surface of the diffusion barrier layer.

Therefore, the second copper layer cannot be deposited on sidewalls of the opening so that the void is happened therein and the filling capability is deteriorated. And further, this makes the resistance of the copper interconnection increased and causes a reliability problem of the device at last.

SUMMARY OF THE INVENTION

It is, therefore, an object of the present invention to provide a method for manufacturing a copper interconnection with an enhanced filling capability by using a protection layer after forming a diffusion barrier layer using a damascene process.

In accordance with one aspect of the present invention, there is provided a method for manufacturing a metal interconnection, the method comprising the steps of: a) preparing an active matrix provided with a substrate, an insulating layer and an opening formed through the insulating layer; b) forming a diffusion barrier layer on surfaces of the opening and the insulating layer; c) forming a protection layer on the diffusion barrier layer; d) forming a first metal layer into the opening and upon the protection layer; e) forming a second metal layer on the first metal layer; and f) polishing back the first and the second metal layer to a top surface of the insulating layer, thereby forming a metal interconnection.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Referring to FIGS. 2A to 2E, there are provided cross sectional views setting forth a method for manufacturing a copper interconnection in a semiconductor device in accordance with a preferred embodiment of the present invention.

Figure 1A:
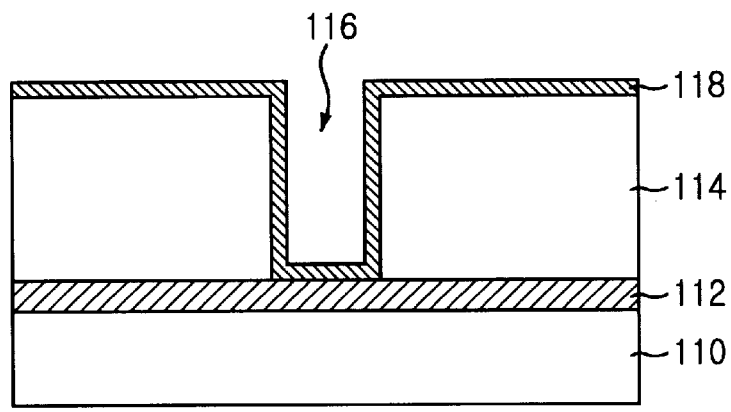
FIGS. 1A, 1B, 1C, and 1D are cross sectional views setting forth a conventional method for manufacturing a copper interconnection.
Figure 1B:
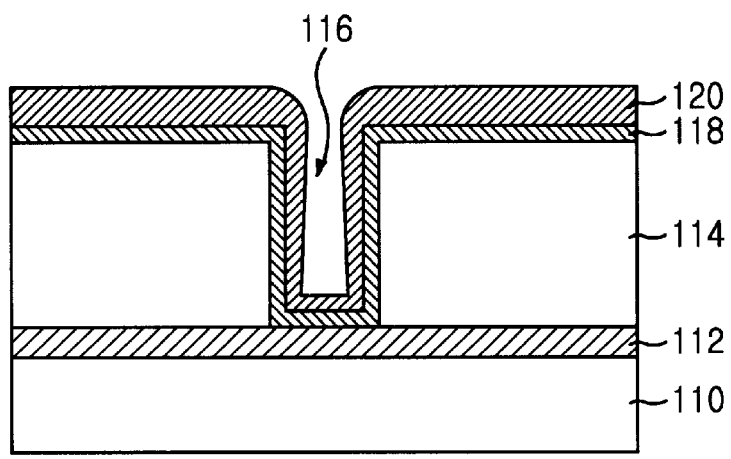
Figure 1C:
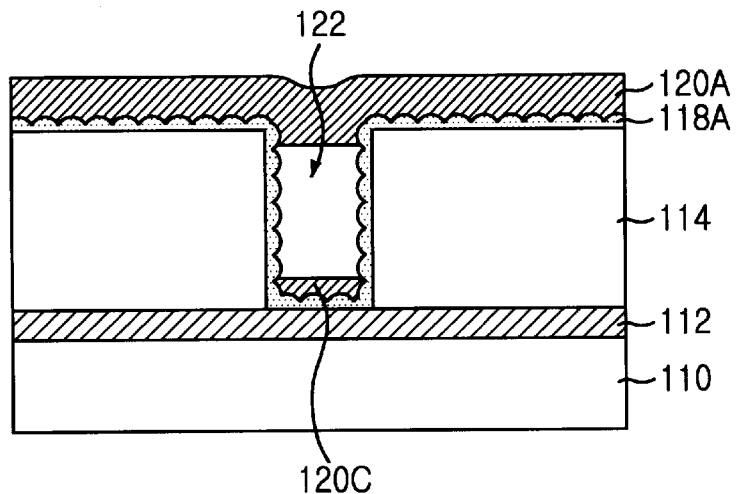
Figure 1D:
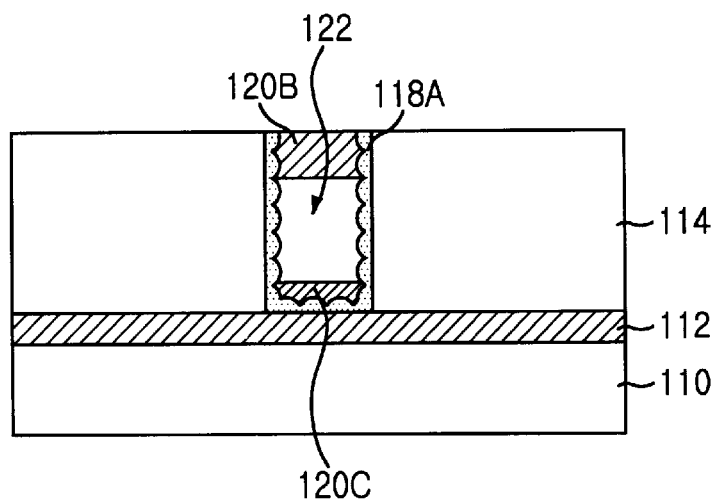
Figure 2A:
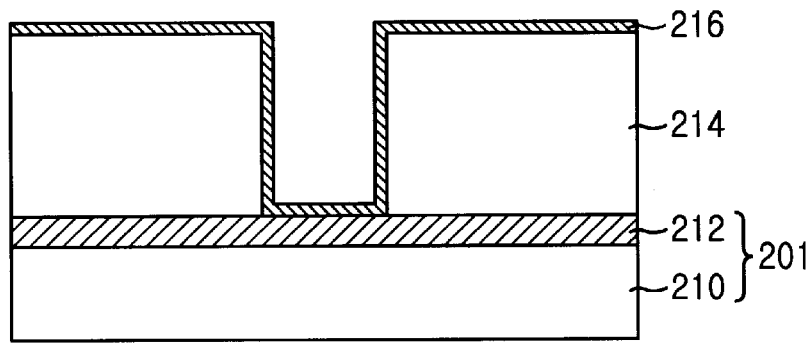
FIGS. 2A, 2B, 2C, 2D, and 2E are cross sectional views setting forth a method for manufacturing a copper interconnection in accordance with a preferred embodiment of the present invention.

Referring to FIG. 2A, the manufacturing steps begin with a preparation of an active matrix 201 provided with a conductive layer 212 and a substrate 210. And an insulating layer 214 is formed on top of the conductive layer 212 and then, patterned into a predetermined configuration by preferably using a damascene process, thereby obtaining an opening 220. Thereafter, a diffusion barrier layer 216, e.g., made of titanium/titanium nitride (Ti/TiN), is formed on entire surface including the opening 220 for preventing a penetration of copper atoms into the insulating layer 214.

Figure 2B:
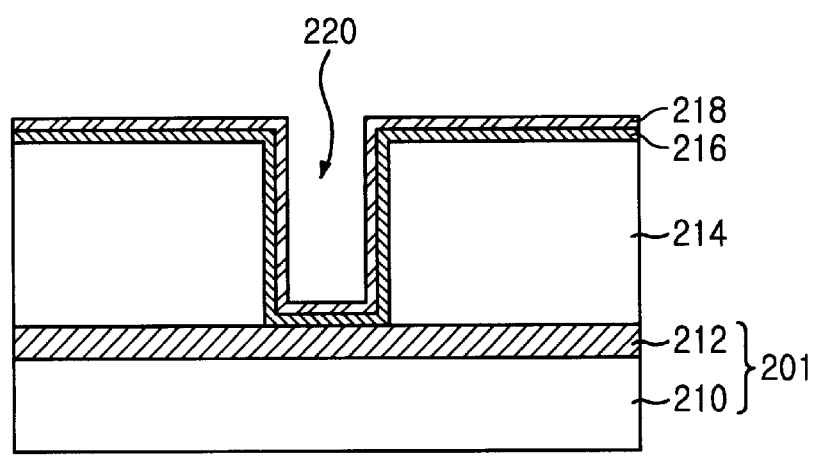

In an ensuing step as shown in FIG. 2B, a protection layer 218 is formed on top of the diffusion barrier layer for minimizing a size of intermetallic compound produced thereon. Thus, the protection layer 218 is made of a material which hardly reacts with copper, e.g., made of niobium (Nb), zinc (Zn), magnesium (Mg), zirconium (Zr) or the like. The formation of the protection layer 218 is accomplished by a physical vapor deposition (PVD) technique.

Figure 2C:
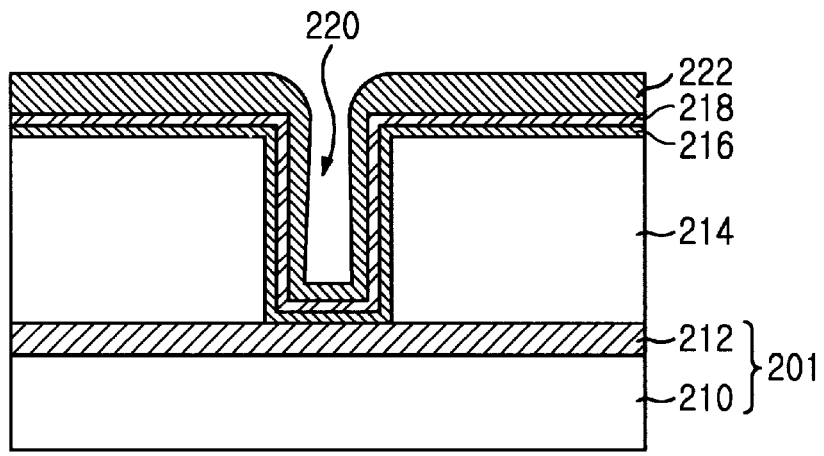

In a next step as shown in FIG. 2C, a first copper layer 222 is formed on the protection layer 218 with a thickness of less than approximately 1,000 angstroms by using a method such as the PVD technique at a room temperature in an ambient atmosphere of inert gas.

Figure 2D:
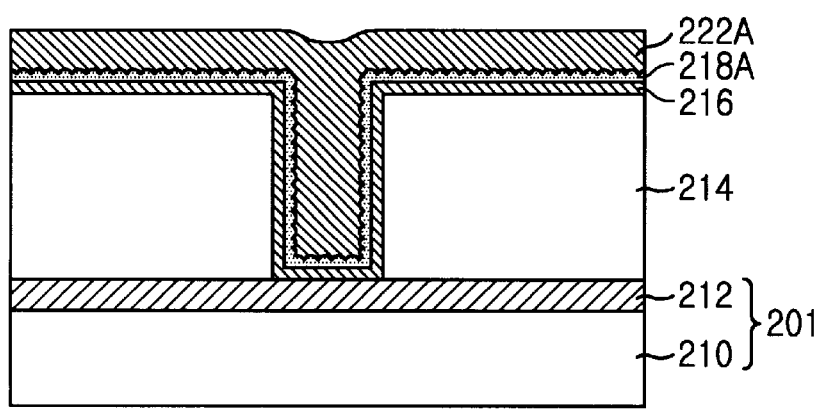

In a subsequent step as shown in FIG. 2D, a second copper layer is formed on top of the first copper layer 222 at the temperature ranging from 400° C. to 1,000° C. with the thickness of more than approximately 3,000 angstroms for reflowing copper into the opening 220 by using the PVD technique, thereby obtaining a complete copper layer 222A. While depositing copper at a high temperature by the PVD technique, an intermetallic compound 218A may be produced on the surface of the protection layer 218. But since the protection layer 218 is made of the material which minimally reacts with copper, the intermetallic compound, e.g., $Cu_3Nb$, $Cu_3Zn$, $Cu_3Mg$, or $Cu_3Zr$, has a smaller size of grain than that of the prior art, which employs only a diffusion barrier layer.

Figure 2E:
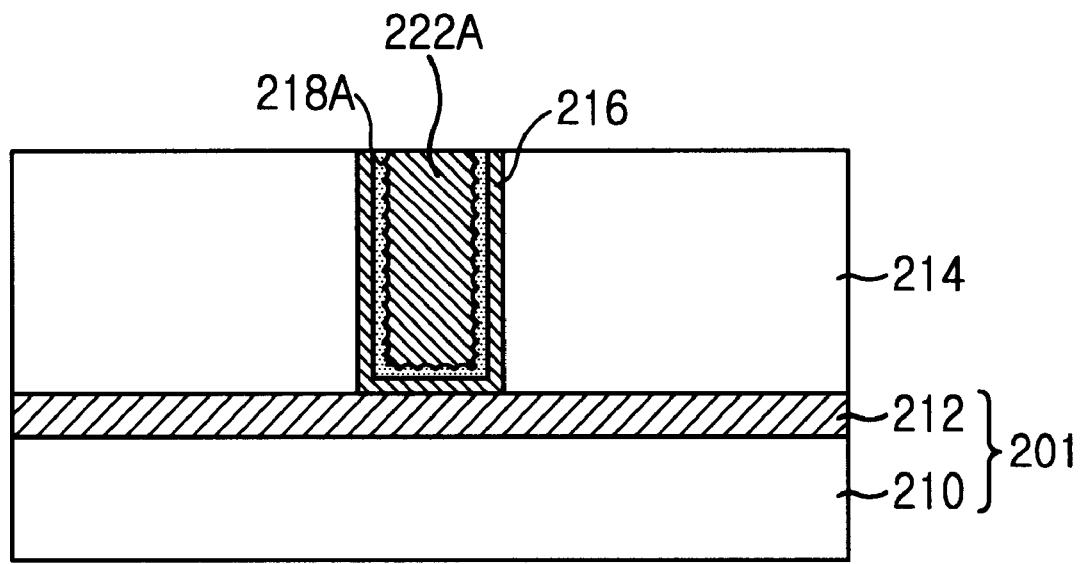

Finally, a copper layer is polished back to a top surface of the insulating layer 214, thereby a copper interconnection 222B being remained within the opening 220 as shown in FIG. 2E. Polishing back of the copper layer is accomplished by a chemical mechanical polishing (CMP) technique.

In the embodiment of the present invention, although copper is used as the metal interconnection, silver (Ag), platinum (Pt) or gold (Au) can be utilized as the metal interconnection by using the same method of the present invention.

In comparison with the prior art, the present invention provides an enhanced filling capability by using the protection layer 218 between the diffusion barrier layer 216 and the first copper layer 222 so that the reliability of the device may be improved.

While the present invention has been described with respect to the particular embodiments, it will be apparent to those skilled in the art that various changes and modifications may be made without departing from the scope of the invention as defined in the following claims.

What is claimed is:

1. A method for forming a metal interconnection comprising the steps of:

a) preparing an active matrix, an insulating layer over the active matrix, and an opening in the insulating layer;

b) forming a diffusion barrier layer covering the opening and the insulating layer;

c) forming a protection layer over the diffusion barrier layer, wherein said protection layer includes a material selected from zinc (Zn), magnesium (Mg), or zirconium (Zr);

d) forming a first metal layer covering the opening and the protection layer;

e) forming a second metal layer over the first metal layer; and f) polishing the first and second metal layers for at least partially exposing the insulating layer, to form a metal interconnection.

2. The method as recited in claim 1, wherein the step of forming a protection layer includes forming the protection layer having a thickness of less than 500 angstroms by using a physical vapor deposition (PVD) technique.

3. The method as recited in claim 1, wherein the metal interconnection includes copper (Cu).

4. The method as recited in claim 1, wherein the metal interconnection includes a material selected from silver (Ag), platinum (Pt) or gold (Au).

5. The method as recited in claim 1, wherein the thickness of the first metal layer is less than 1,000 angstroms.

6. The method as recited in claim 1, wherein the thickness of the second metal layer is more than 3,000 angstroms.

7. The method as recited in claim 1, wherein the step of forming a first metal layer includes forming the first metal layer at a room temperature by using a physical vapor deposition (PVD) technique.

8. The method as recited in claim 1, wherein the second metal layer is formed in an inert gas ambient atmosphere comprising $N_2$, Ar, Xe, or He by using a physical vapor deposition (PVD) technique.

* * * * *